(12) United States Patent  
Hoelen et al.

(10) Patent No.: US 9,349,924 B2  
(45) Date of Patent: May 24, 2016

(54) ILLUMINATION DEVICE WITH REMOTE LUMINESCENT MATERIAL

(75) Inventors: Christoph Gerard August Hoelen, Valkenswaard (NL); Adriaan Valster, Waalre (NL)

(73) Assignee: KONINKLIJKE PHILILPS N.V., Eindhoven (NL)

( * ) Notice: Subject to any disclaimer, the term of this patent is extended or adjusted under 35 U.S.C. 154(b) by 928 days.

(21) Appl. No.: 13/256,956

(22) PCT Filed: Mar. 17, 2010

(86) PCT No.: PCT/IB2010/051147  
§ 371 (c)(1),  
(2), (4) Date: Sep. 16, 2011

(87) PCT Pub. No.: WO2010/106504  
PCT Pub. Date: Sep. 23, 2010

(65) Prior Publication Data  
US 2012/0007130 A1    Jan. 12, 2012

(30) Foreign Application Priority Data  
Mar. 19, 2009   (EP) .................................... 09155556

(51) Int. Cl.  
*H01L 27/15*  (2006.01)  
*H01L 33/50*  (2010.01)  
(Continued)

(52) U.S. Cl.  
CPC ............ *H01L 33/504* (2013.01); *H01L 33/644* (2013.01); *F21K 9/56* (2013.01); *F21V 7/05* (2013.01); *F21V 29/505* (2015.01); *F21Y 2101/02* (2013.01); *H01L 33/44* (2013.01); *H01L 33/507* (2013.01); *H01L 33/52* (2013.01); *H01L 33/60* (2013.01); *H01L 2924/0002* (2013.01)

(58) Field of Classification Search  
CPC . H01L 33/502; H01L 33/504; H01L 25/0753; H01L 2933/0041; H01L 33/52; H01L 2924/0002; H01L 2924/00; H01L 33/44; H01L 33/507; H01L 33/60; H01L 33/644; F21K 9/56; F21V 29/505; F21V 7/05  
USPC ...................................................... 257/79–100  
See application file for complete search history.

(56) References Cited

U.S. PATENT DOCUMENTS 7,213,940 B1    5/2007  Van De Ven et al.  
7,600,882 B1 *  10/2009  Morejon et al. ................ 362/84  
(Continued)

FOREIGN PATENT DOCUMENTS

EP    1605199 A2    12/2005  
JP    20031531 A    1/2003  
(Continued)

*Primary Examiner* — H Tsai

(57) ABSTRACT

The invention provides an illumination device comprising a light source and a transmissive arrangement. The light source is arranged to generate light source light and comprises a light emitting device (LED), arranged to generate LED light and a carrier comprising a first luminescent material. The carrier is in contact with the LED and the first luminescent material is arranged to convert at least part of the LED light into first luminescent material light. The transmissive arrangement of a second luminescent material is arranged remote from the light source and is arranged to convert at least part of the LED light or at least part of the first luminescent material light and/or at least part of the LED light. The invention overcomes current limitations of remote luminescent material systems in spot lighting. In addition, an extremely simple way of realizing light sources with various correlated color temperatures is allowed, based on just a single type of white (or whitish) light source in combination with various (red-orange) remote luminescent materials.

17 Claims, 7 Drawing Sheets

(51) Int. Cl.
*H01L 33/64* (2010.01)
*F21V 7/05* (2006.01)
*H01L 33/44* (2010.01)
*H01L 33/52* (2010.01)
*H01L 33/60* (2010.01)
*F21Y 101/02* (2006.01)
*F21V 29/505* (2015.01)
*F21K 99/00* (2016.01)

(56) References Cited

U.S. PATENT DOCUMENTS

| | | |
|---|---|---|
| 2004/0217692 A1 | 11/2004 | Cho et al. |
| 2005/0269582 A1* | 12/2005 | Mueller et al. ............ 257/94 |
| 2006/0076883 A1* | 4/2006 | Himaki et al. ............ 313/503 |
| 2008/0023712 A1* | 1/2008 | Mueller et al. ............ 257/98 |
| 2008/0029720 A1 | 2/2008 | Li |
| 2008/0128735 A1 | 6/2008 | Yoo et al. |
| 2008/0265268 A1 | 10/2008 | Braune et al. |

FOREIGN PATENT DOCUMENTS

| | | |
|---|---|---|
| JP | 2005244075 A | 9/2005 |
| JP | 200632726 A | 2/2006 |
| WO | 2005083036 A2 | 9/2005 |
| WO | 2006111907 A2 | 10/2006 |
| WO | 2008047290 A1 | 4/2008 |
| WO | 2008126038 A1 | 10/2008 |
| WO | 2009093163 A2 | 7/2009 |

* cited by examiner

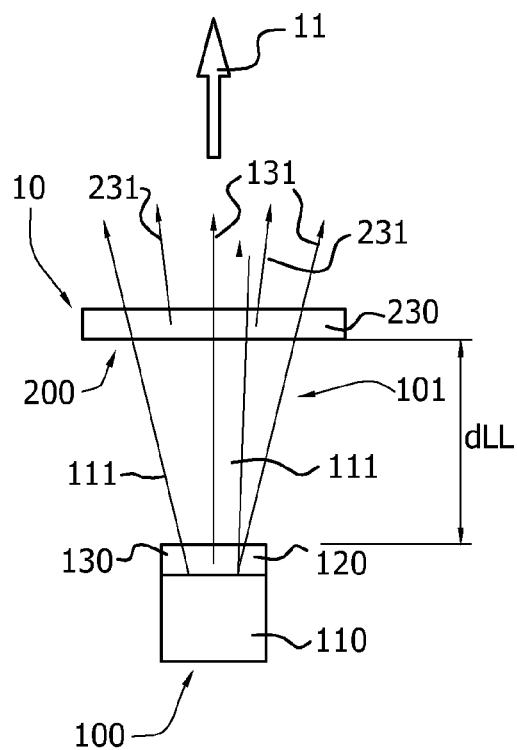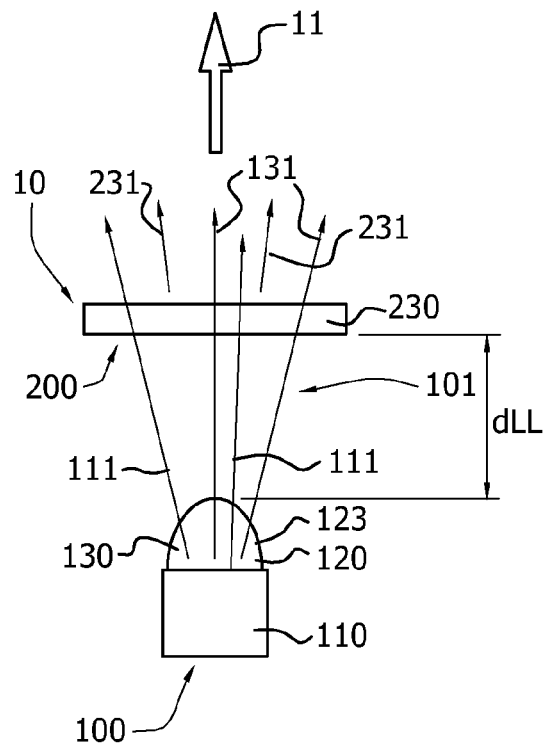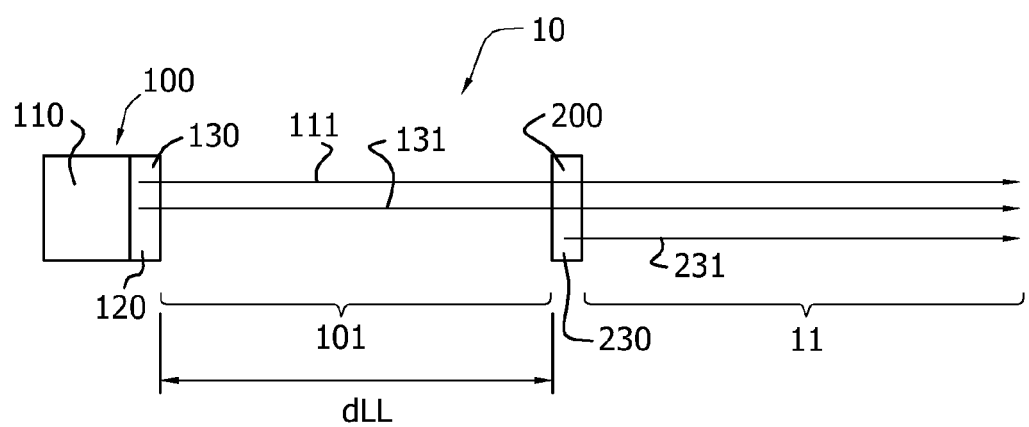

ILLUMINATION DEVICE WITH REMOTE LUMINESCENT MATERIAL

FIELD OF THE INVENTION

The invention relates to an illumination device comprising an LED based light source and a plurality of luminescent materials, with at least one luminescent material being arranged remote from the light source.

BACKGROUND OF THE INVENTION

Illumination devices comprising a transmissive arrangement with a luminescent material are known in the art. Transmissive ceramic layers or luminescent ceramics, and their method of preparation, are known in the art. It is for instance referred to US2005/0269582, US2006/0202105), to WO2006/097868, to WO2007/080555, to US2007/0126017 and to WO2006/114726.

US2005/0269582 for instance, discloses a semiconductor light emitting device combined with a ceramic layer which is disposed in a path of light emitted by the light emitting layer. The ceramic layer is composed of or includes a wavelength converting material such as a luminescent material.

Further, US2008029720 describes a lighting arrangement which comprises: an LED chip, configured to emit radiation having a first wavelength range; a luminescent material, configured to absorb at least a portion of said first wavelength range radiation and to emit radiation having a second wavelength range; and an optical component, through which at least said first wavelength range radiation passes. The LED is characterized in that the luminescent material is provided on a surface of the optical component.

WO2005083036 describes an LED lamp including an LED and one or more luminescent materials, wherein for each luminescent material, a figure of merit (FOM) defined as the product of (incident LED flux)×(excitation cross-section of the luminescent material)×(luminescent material decay time) is less than 0.3. Such a transmissive arrangement is assumed to provide a light emitting device with improved lumen output and colour stability over a range of drive currents.

Further, luminescent multilayers are known in the in the art. US2004217692 for instance describes a light-emitting device including a light source outputting an excitation light and a fluorescent multilayer having at least two fluorescent layers emitting different wavelengths in response to the excitation light. A fluorescent layer emitting a longer wavelength and/or having a lower light conversion efficiency than other fluorescent layers is adjacent to the light source. A fluorescent layer emitting a shorter wavelength and/or having a higher light conversion efficiency than other fluorescent layers, is farthest from the light source. Accordingly, it is possible to increase the overall light conversion efficiency of the light-emitting device and the amount of light output from the light-emitting device.

U.S. Pat. No. 7,213,940 describes a lighting device comprising first and second groups of solid state light emitters, which emit light having dominant wavelength in ranges of from 430 nm to 480 nm and from 600 nm to 630 nm, respectively, and a first group of lumiphors which emit light having dominant wavelength in the range of from 555 nm to 585 nm. If current is supplied to a power line, a combination of light exiting the lighting device which was emitted by the first group of emitters, and light exiting the lighting device which was emitted by the first group of lumiphors would, in an absence of any additional light, produce a sub-mixture of light having x, y colour coordinates within a specific area on a 1931 CIE Chromaticity Diagram.

SUMMARY OF THE INVENTION

For spot lamps, a high brightness of the source is required, i.e., for a requested luminous flux level the emitting source is limited in size to fit in a spot lamp. Typically the source size of a remote luminescent material module does not fit in a spot lamp. When reducing the remote luminescent material surface area to fit in the spot applications, the temperature of the remote luminescent material element may increase to unacceptable levels, leading to thermal quenching of the luminescent material, which significantly reduces the system efficiency, and/or to material degradation (the luminescent material, or the matrix material comprising the luminescent material, or the substrate material that the luminescent material is applied onto) resulting in lumen depreciation, reduced lifetime and increased catastrophic system failures. This is in particular the case for the generation of warm white light as compared to cool white light, as this requires more heat generation in the wavelength converting material.

It appears that a relative high source brightness can be achieved with white LEDs where the wavelength converting material is applied on the LED chip, as this results in a small source size. However, a disadvantage of warm white LEDs is that the red luminescent material component may be more sensitive to temperature than the yellow component, which may result in a temperature dependence of the colour point and possibly a colour shift over time.

In an alternative configuration, efficient yellowish LEDs composed of a blue InGaN chip with a luminescent material component on the chip could be combined with a red AlInGaP LED. Mixing of the right proportions of the light from these emitters can also result in efficient generation of warm white light. However, a disadvantage is that the mixing leads to a relative large source with consequently a relative low brightness, making this unsuitable for e.g. spot lamps. Another disadvantage is found in the strong difference in temperature sensitivity of the InGaN versus the AlInGaP LED materials, making such a system inherently unstable with respect to the colour point as well as the luminous flux. In addition, this system requires a 2-channel driver with accurate fine-tuning between the two channels to achieve the targeted colour point, resulting in a more complex, more voluminous, and more expensive system. Finally, differential ageing of the different LED material systems also may reduce the colour consistency between lamps if no very accurate feedback system is implemented.

Hence, it is an aspect of the invention to provide an alternative illumination device, which preferably further at least partly obviates one or more of above-described drawbacks.

The invention may enable a significant increase in brightness (about a factor 10) of a remote luminescent material light source, while offering at least part of the efficacy increase of remote luminescent material LED engines, resulting in more efficient LED sources for e.g. spot lamps. Further, with the proposed configurations, the temperature of the luminescent material components can be lower, resulting in a more stable light source.

In a first embodiment, the invention provides an illumination device comprising:
a. a light source, arranged to generate light source light, comprising:
i. a light emitting device (LED), arranged to generate LED light;

ii. a carrier comprising a first luminescent material, wherein the carrier is in contact with the LED, and wherein the first luminescent material is arranged to convert at least part of the LED light into first luminescent material light; and b. a transmissive arrangement of a second luminescent material, arranged remote from the light source, and arranged to convert at least part of the LED light or at least part of the first luminescent material light, or at least part of the LED light and at least part of the first luminescent material light into second luminescent material light.

With the proposed configuration, the efficacy of light sources for spot lamps can be increased by utilizing the LED light extraction advantage of the remote luminescent material concept.

The invention provides embodiments how to overcome the current limitations of remote luminescent material systems in spot lighting. In addition, an extremely simple way of realizing light sources with various correlated colour temperatures is allowed, based on just a single type of white (or whitish) light source in combination with various (red-orange) remote luminescent materials. Simply by varying the luminescent material load and/or distance of the transmissive arrangement to the light source, and/or varying the irradiated (fractional) area of the transmissive arrangement, it appears that the correlated colour temperature of the light generated by the illumination device can be varied. Thus, the invention may also enable in an extremely simple way adjusting the correlated colour temperature (CCT) along the black body locus (BBL), i.e., without even having to adjust both a red phosphor contribution and a yellow-green phosphor contribution.

In an embodiment, the LED comprises a blue emitting LED, the first luminescent material is arranged to emit light with a dominant wavelength in the yellow-green spectral range, and wherein the second luminescent material is arranged to emit light with a dominant wavelength in the red-orange range.

In a specific embodiment, the LED comprises a blue emitting LED, wherein the first luminescent material comprises one or more luminescent materials selected from the group consisting of a trivalent cerium containing garnet, a divalent europium containing oxynitride, a divalent europium containing silicate, a divalent europium containing thiogallate, preferably at least a trivalent cerium containing garnet, and wherein the second luminescent material comprises one or more luminescent materials selected from the group consisting of a trivalent cerium containing earth alkali sulphide and a divalent europium containing nitride, preferably at least a divalent europium containing nitride. Examples of (other) luminescent materials emitting in the green are e.g. SrSiON:Eu (oxynitride), or (Sr,Ba,Ca)SiO$_4$:Eu (silicate) and SrGa$_2$S$_4$:Eu (thiogallate). An example of (another) red luminescent material is e.g. (Ca$_{1-x}$Sr$_x$)S:Ce (earth alkali thiogallate). Examples of suitable luminescent materials are for instance also described in WO0211173.

Especially preferred is an embodiment wherein the LED comprises a blue emitting LED, wherein the first luminescent material comprises a trivalent cerium containing garnet, and wherein the second luminescent material comprises a divalent europium containing nitride, especially a divalent europium containing nitridosilicate. Further, preferably the second luminescent material comprises CaAlSiN$_3$:Eu.

Several embodiments of the carrier are proposed. Preferably, a (major) part of the wavelength conversion is applied in close contact with the LED, via which also the heat that is generated in the luminescent material comprised by the carrier may be conducted away to the housing of the illumination device or to a thermal interface of the illumination device that leads the heat to a heat sink. This means that most of the heat that is generated in the luminescent material (Stokes losses as well as quantum efficiency losses) may be transferred to ambient via conduction through the LED. Therefore, the carrier is preferably also in contact with a heat sink (in addition to being in contact with the LED).

In an embodiment, the carrier comprises a luminescent ceramic. For the luminescent material in the light source (i.e. LED package), a transparent or highly translucent luminescent element (e.g. an (almost transparent) luminescent ceramic such as trivalent cerium containing garnet like YAG:Ce, in good thermal contact with the LED, can be used. In this way, the light extraction from the package is relative high (thanks to the low back scattering of light into the die) and the luminescent material temperature close to the temperature of the die.

In another embodiment, the carrier comprises a luminescent material layer.

In yet a further embodiment, the carrier comprises an encapsulant, such as a resin, comprising the first luminescent material. In yet another embodiment, the carrier, such as a luminescent material layer or a luminescent ceramic, is enclosed by an encapsulant, wherein the encapsulant may (also) or may not comprise luminescent material. Preferably, the carrier is thus in contact with a heat sink. The encapsulant is transmissive for at least part of the visible light. Transmissive resins are known in the art. Encapsulants may for instance be polymer resins or silicon resins or in an embodiment a sol gel based system.

The arrangement is arranged remote from the light source. Several embodiments for the transmissive arrangement are proposed. In an embodiment, the transmissive arrangement comprises a coating coated to an exit window, wherein the coating comprises the second luminescent material.

In yet another embodiment, the transmissive arrangement comprises an exit window comprising the second luminescent material. For instance, such exit window may (also) comprise a luminescent ceramic.

In an embodiment, the exit window has a hollow shape and encloses at least partially the light source.

Preferably, a red or red-orange luminescent material as a second luminescent element remote from the LED may be applied. These luminescent materials may be highly scattering, and therefore improve the system efficiency considerably when applied remote from the LED such that only a small fraction of the light impinging on this second element is scattered back onto the die of the LED or on the package of the LED.

Further, preferably for the second luminescent element a luminescent material is selected that primarily absorbs and converts light that was converted by the carrier (more precisely: luminescent material comprised by the carrier) into light with a wavelength in between that of the pump light from the LED and the light emitted by the second luminescent material; this may result in a significantly reduced heat dissipation in the second element thanks to the reduced Stokes shift. Therefore, preferably the second luminescent material is arranged to convert at least part of the first luminescent material light.

Further, preferably, for the second luminescent element a luminescent material is selected that shows a low thermal quenching to enable high power densities on this element, e.g. nitride luminescent materials.

Yet, in another embodiment, the transmissive arrangement (especially the luminescent material comprised by the arrangement) is mounted in good thermal contact with a thermal conductor that can lead the heat that is generated in this second element to e.g. the housing of the lamp. Hence, preferably the transmissive arrangement is also in contact with a heat sink. In this way, heat generated in the luminescent material, as a result of Stokes-shift losses and/or quantum efficiency losses, may be guided away, thereby minimizing efficiency losses. Preferably, the carrier and the transmissive arrangement are in contact with a heat sink.

In another embodiment, the luminescent material comprised by the transmissive arrangement is applied in a close packing density to enhance thermal conduction in this element, e.g. by pressing the luminescent material powder to a high packing density (where preferably also an embedding material is in place to enhance thermal conduction) or by applying a monolithic ceramic luminescent material (also known in the art as Lumiramic).

The term "first luminescent material" may also refer to a plurality of (first) luminescent materials, that may be provided as mixture, but may for instance also be provided as (adjacent) layers. The term "second luminescent material" may also refer to a plurality of (second) luminescent materials, that may be provided as mixture, but may for instance also be provided as (adjacent) layers. Other embodiments may also be possible, such as a transmissive arrangement comprising an upstream coating with a second luminescent material that may be identical or may be different from a second luminescent material comprised in a downstream coating.

It surprisingly appears that with a substantially white light source and a red or orange-red remote luminescent material, relatively easy the CCT can be varied. Therefore, in an embodiment, the light source light is white light, having a colour point within 15 SDCM (standard deviation of colour matching) of the black body locus (BBL).

The illumination device may be used for different applications, such as a (retrofit) spot light, but also for non-retrofit spot lamps. The illumination device may be used for general lighting, including homes, hospitality, shops and office lighting, and also in automotive, such as daytime running lights. The proposed configurations can be applied in large area lighting, ambiance lighting (e.g. light tiles), backlighting (e.g. poster boxes), downlighters, diffuse retrofit lamps such as incandescent (GLS) or TL replacement lamps, and wall washers and, depending on volume and beam constraints, in many types of spot lamps.

In an embodiment, the device therefore further comprises a collimator, to collimate the device light. Especially, the illumination device may be arranged to generate illumination device light comprising first luminescent material light and second luminescent material light and optionally LED light, wherein the illumination device further comprises a collimator which at least partially encloses the light source and the transmissive arrangement and which is arranged to collimate the illumination device light.

Below, some aspects are described in more detail.

Illumination Device

Relative to the LED(s) the carrier and the transmissive arrangement are arranged downstream of the LED(s).

The carrier is in contact with the LED(s). One (larger) carrier may be arranged over a plurality of LEDs. Further, a plurality of LEDs each comprising a carrier may also be applied. The carrier is substantially directly downstream of the LED, and preferably substantially in contact with the LED die. The phrase "carrier in contact with the LED" especially indicates that at least part of the carrier is in contact with at least part of the die. Preferably, substantially the entire die is in contact with (at least part of) the carrier.

The terms "upstream" and "downstream" relate to an arrangement of items or features relative to the propagation of the light from a light generating means (here especially the LED), wherein relative to a first position within a beam of light from the light generating means, a second position in the beam of light closer to the light generating means is "upstream", and a third position within the beam of light further away from the light generating means is "downstream".

The illumination device may comprise one or more light sources. Further, the illumination device may comprise one or more LEDs and one or more carriers, including embodiments with a plurality of LEDs and a carrier in contact with this plurality of LEDs.

The transmissive arrangement is preferably arranged in such a way, that substantially all emission generated by the light source(s) is directed in the direction of the transmissive arrangement; i.e. the transmissive arrangement is disposed in a path of light emitted by the light source(s). Hence, in a preferred embodiment, the luminescent material and/or the transmissive arrangement receive substantially all light source(s) light. Since in an embodiment the distance between the transmissive arrangement and the light source(s) is non-zero, there may be an chamber or cavity, enclosed by the light source, the transmissive arrangement and optionally cavity walls. The transmissive arrangement may receive substantially all light source(s) light after internal reflection in the chamber or cavity.

The transmissive arrangement comprising the second luminescent material is especially arranged to transmit at least part of the light source(s) light. In this way, the light source(s), with (transmissive arrangement) transmitted light source(s) emission and the second luminescent material with second luminescent material emission are arranged to generate light of a predetermined colour (such as white light).

The transmissive arrangement has an upstream face directed to the light source(s) and a downstream face directed to the exterior of the illumination device.

Further optics are not excluded, such as collimators, reflectors, light guides, optical layers etc. to guide or influence the illumination device light, which may be arranged downstream of the exit window.

With the invention, remote luminescent material modules can be realized that have very high efficiency and good colour rendering, and that now also can appear white or almost colour-neutral when in off-state. A colour-neutral appearance may be obtained by applying one or more optical layers or coatings on the downstream surface of the transmissive element. The optical layers may comprise e.g. scattering particles, scattering polymers, or dichroic optical stacks. The proposed systems with the second luminescent material in or on a transmissive arrangement, such as a film, also enable cheap mass production by roll-to-roll processing, and combine homogenisation with efficiency optimization. Alternatively injection molding can be used as a cheap mass production technology enabling large flexibility in shape and size of the transmissive arrangement.

Optionally, the transmissive arrangement may comprise a non-uniform distribution of the luminescent material. For instance, a non-uniform distribution of the second luminescent material may enhance the tuning capability.

Carrier

The carrier is preferably directly in contact with the LED die. The carrier may comprise a encapsulant comprising the first luminescent material, but the carrier may also comprise a luminescent ceramic (see also below), arranged on the LED die. The carrier may also comprise a luminescent layer, arranged on the LED die. Bot the luminescent ceramic and the luminescent layer may be enclosed by a encapsulant, which may optionally also comprise the first luminescent material. The carrier is preferably in contact with a heat sink, in order to let heat generated in the carrier flow away.

The LED and the carrier together are indicated as "light source".

Reflector & Cavity

The non-zero distance between the transmissive arrangement and the light source may for instance be achieved with embodiments wherein the light source is arranged in a cavity or chamber (see also above), and the transmissive arrangement is part of an enclosing structure. The enclosing structure may substantially consist of the transmissive arrangement, but in general, only part of the enclosing structure consists of the arrangement. Other parts of the enclosing structure may be a printed circuit board (PCB; sometimes also indicated as printed wire board (PWB)).

In an embodiment, the cavity may (further) comprise a cavity reflector arranged to reflect LED light and optionally luminescent material emission back into the cavity, wherein the cavity reflector has a reflectivity under perpendicular irradiation of visible light of at least about 95%, especially at least about 98% in at least the blue region.

In a specific embodiment, the cavity reflector comprises a diffuse reflector, and more especially is a diffuse reflector. In an embodiment, the cavity reflector comprises one or more materials selected from the group consisting of Teflon, MCPET (micro-foamed polyethylene terephthalate), and particulate $TiO_2$ in a matrix material. In another embodiment, the cavity reflector comprises a specular reflector, and more especially is a specular reflector. In yet another embodiment, the cavity reflector comprises a diffuse and specular reflector. For instance, the reflector may be partially specular and partially diffuse.

In an embodiment, the cavity may have a form selected from the group consisting of a cylinder, a cube, a cuboid (also called a rectangular prism), pentagonal prism, and a hexagonal prism (i.e. a hexagonal shape). In a specific embodiment, the cavity has the form of a cylinder. In yet another specific embodiment the cavity has a hexagonal shape. Especially in case of hexagonal shapes/forms, the cavity reflector may comprise a specular reflector or a combination of a diffuse and specular reflector. Preferably, the cavity reflector may have a conical, a paraboloid, or an ellipsoid shape.

Remote luminescent material in LED based light sources seems to be very advantageous with respect to system efficacy, in particular for generation of light with a low colour temperature (warm white). Applying a luminescent material coating on a transmissive arrangement or film may result in high system efficacy because only little light may be reflected back into the LED where it has a rather high chance of being absorbed. Using the luminescent material remote from the LEDs can result in efficacy gains up to about 50% compared to systems with luminescent material in the LED package.

LED and Luminescent Material

In an embodiment, the LED is arranged to emit blue emission and the first luminescent material comprises (a) a green luminescent material, arranged to absorb at least part of the blue LED light and to emit green emission, and (b) the second luminescent material comprises an orange-red and/or a red luminescent material, arranged to absorb at least part of the blue LED light, or at least part of the green emission, or both at least part of the blue emission and at least part of the green emission and to emit red emission. In this way, the illumination device light (of a predetermined colour) may be white light. Depending upon amongst others LED power, the blue LED light spectrum, and luminescent material amounts white light of different colour temperatures may be composed.

In another embodiment, the LED is arranged to emit blue emission and the first luminescent material comprises (a) a yellow luminescent material, arranged to absorb at least part of the blue emission and to emit yellow emission, and (b) the second luminescent material comprises an orange-red and/or a red luminescent material, arranged to absorb at least part of the blue LED light, or at least part of the yellow emission, or both at least part of the blue emission and at least part of the yellow emission and to emit red emission. This red luminescent material may amongst others be applied to further improve the CRI.

In an embodiment, the illumination device comprises a plurality of light emitting diodes (LEDs) arranged to emit LED light, such as in the order of 2-100, like 4-64.

The term white light herein, is known to the person skilled in the art. It especially relates to light having a correlated colour temperature (CCT) between about 2000 and 20000 K, especially 2700-20000 K, for general lighting especially in the range of about 2700 K and 6500 K, and for backlighting purposes especially in the range of about 7000 K and 20000 K, and especially within about 15 SDCM (standard deviation of colour matching) from the BBL, especially within about 10 SDCM from the BBL, even more especially within about 5 SDCM from the BBL.

The terms "blue light" or "blue emission" especially relates to light having a wavelength in the range of about 410-490 nm. The term "green light" especially relates to light having a wavelength in the range of about 500-570 nm. The term "red light" especially relates to light having a wavelength in the range of about 590-650 nm. The term "yellow light" especially relates to light having a wavelength in the range of about 560-590 nm.

These terms do not exclude that especially the luminescent material may have a broad band emission having emission with wavelength(s) outside the range of for instance about 500-570 nm, about 590-650 nm, and about 560-590 nm respectively. However, the dominant wavelength of emissions of such luminescent materials (or of the LED, respectively) will be found within the herein given ranges, respectively. Hence, the phrase "with a wavelength in the range of" especially indicates that the emission may have a dominant emission wavelength within the specified range.

Especially preferred luminescent materials are selected from garnets and nitrides, especially doped with trivalent cerium or divalent europium, respectively.

Embodiments of garnets especially include $A_3B_5O_{12}$ garnets, wherein A comprises at least yttrium or lutetium and wherein B comprises at least aluminium. Such garnet may be doped with cerium (Ce), with praseodymium (Pr) or a combination of cerium and praseodymium; especially however with Ce. Especially, B comprises aluminium (Al), however, B may also partly comprise gallium (Ga) and/or scandium (Sc) and/or indium (In), especially up to about 20% of Al, more especially up to about 10% of Al (i.e. the B ions essentially consist of 90 or more mole % of Al and 10 or less mole % of one or more of Ga, Sc and In); B may especially comprise up to about 10% gallium. In another variant, B and O may at least partly be replaced by Si and N. The element A may especially be selected from the group consisting of yttrium (Y), gadolinium (Gd), terbium (Tb) and lutetium (Lu). Further, Gd and/or Tb are especially only present up to an amount of about 20% of A. In a specific embodiment, the garnet luminescent material comprises $(Y_{1-x}Lu_x)_3B_5O_{12}$:Ce, wherein x is equal to or larger than 0 and equal to or smaller than 1.

The term ":Ce", indicates that part of the metal ions (i.e. in the garnets: part of the "A" ions) in the luminescent material is replaced by Ce. For instance, assuming $(Y_{1-x}Lu_x)_3Al_5O_{12}$:

Ce, part of Y and/or Lu is replaced by Ce. This notation is known to the person skilled in the art. Ce will replace A in general for not more than 10%; in general, the Ce concentration will be in the range of 0.1-4%, especially 0.1-2% (relative to A). Assuming 1% Ce and 10% Y, the full correct formula could be $(Y_{0.1}Lu_{0.89}Ce_{0.01})_3Al_5O_{12}$. Ce in garnets is substantially or only in the trivalent state, as known to the person skilled in the art.

The red luminescent material may in an embodiment comprise one or more materials selected from the group consisting of $(Ba,Sr,Ca)S:Eu$, $(Ba,Sr,Ca)AlSiN_3:Eu$ and $(Ba,Sr,Ca)_2Si_5N_8:Eu$. In these compounds, europium (Eu) is substantially or only divalent, and replaces one or more of the indicated divalent cations. In general, Eu will not be present in amounts larger than 10% of the cation, especially in the range of about 0.5-10%, more especially in the range of about 0.5-5% relative to the cation(s) it replaces. The term ":Eu", indicates that part of the metal ions is replaced by Eu (in these examples by $Eu^{2+}$). For instance, assuming 2% Eu in $CaAlSiN_3:Eu$, the correct formula could be $(Ca_{0.98}Eu_{0.02})AlSiN_3$. Divalent europium will in general replace divalent cations, such as the above divalent alkaline earth cations, especially Ca, Sr or Ba.

The material $(Ba,Sr,Ca)S:Eu$ can also be indicated as MS:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca).

Further, the material $(Ba,Sr,Ca)_2Si_5N_8:Eu$ can also be indicated as $M_2Si_5N_8:Eu$, wherein M is one or more elements selected from the group consisting of barium (Ba), strontium (Sr) and calcium (Ca); especially, M comprises in this compound Sr and/or Ba. In a further specific embodiment, M consists of Sr and/or Ba (not taking into account the presence of Eu), especially 50-100%, especially 50-90% Ba and 50-0%, especially 50-10% Sr, such as $Ba_{1.5}Sr_{0.5}Si_5N_8:Eu$ (i.e. 75% Ba; 25% Sr). Here, Eu is introduced and replaces at least part of M i.e. one or more of Ba, Sr, and Ca).

Likewise, the material $(Ba,Sr,Ca)AlSiN_3:Eu$ can also be indicated as $MAlSiN_3:Eu$, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca).

The term luminescent material herein especially relates to inorganic luminescent materials, which are also sometimes indicated as luminescent materials. These terms are known to the person skilled in the art.

Preferably, in an embodiment the second luminescent material comprises $(Ca,Sr,Ba)AlSiN_3:Eu$, preferably $CaAlSiN_3:Eu$. Further, in another embodiment, which may be combined with the former, the second luminescent material comprises $(Ca,Sr,Ba)_2Si_5N_8:Eu$, preferably $(Sr,Ba)_2Si_5N_8:Eu$. The terms "(Ca,Sr,Ba)" indicate that the corresponding cation may be occupied by calcium, strontium or barium. It also indicates that in such material corresponding cation sites may be occupied with cations selected from the group consisting of calcium, strontium and barium. Thus, the material may for instance comprise calcium and strontium, or only strontium, etc.

As will be clear to the person skilled in the art, also combinations of first luminescent materials may be applied. Likewise, also combinations of second luminescent material may be applied.

Further, as will be clear to the person skilled in the art, optimisation of the luminescent material(s) with respect to one or more of constituting elements, activator concentration, particle size, etc. or optimisation with respect to luminescent material combination(s), may be applied to optimize the illumination device.

Transmissive Arrangement

Especially at a non-zero distance from the light source (i.e. especially from the carrier), a transmissive arrangement is arranged.

The term "transmissive" herein may in an embodiment refer to transparent and may in another embodiment refer to translucent. These terms are known to the person skilled in the art. Transmissive especially indicates that transmission of light by the transmissive arrangement, in one or more parts of the whole visible range (i.e. about 380-680 nm), is for instance at least about 2%, more especially at least about 5%, even more especially at least about 10% (under perpendicular irradiation of the transmissive arrangement with the light). Assuming a light source providing blue light, preferably at least part of the blue light may be transmitted by the transmissive arrangement. Further, assuming an upstream arrangement of the second luminescent material, preferably at least part of the emission generated by the second luminescent material(s) is transmitted by the transmissive arrangement, for instance at least about 2%, more especially at least about 5%, even more especially at least about 10% (under perpendicular irradiation of the transmissive arrangement with the light), and preferably even higher, such as at least about 20%, like at least about 40%.

The transmissive arrangement may be self supporting, but it may in an embodiment also be a flexible film, which is for instance stretched (e.g. between cavity walls of the device). The transmissive arrangement may have a substantially flat shape, like a plate, but may in another embodiment have a substantially convex shape, like for instance a dome.

The transmissive arrangement may in an embodiment comprise an organic material. Preferred organic materials are selected from the group consisting of PET (polyethylene terephthalate), PE (polyethylene), PP (polypropylene), PC (polycarbonate), P(M)MA (poly(methyl)metacrylate), Polymethyl methacrylimide (PMMI), PEN (polyethylene napthalate), PDMS (polydimethylsiloxane), and COC (cyclo olefin copolymer). Polycarbonate gave for instance good results.

However, in another embodiment the transmissive arrangement comprises an inorganic material. Preferred inorganic materials are selected from the group consisting of glasses, (fused) quartz, ceramics, and silicones.

As mentioned above, the transmissive arrangement comprises at least part of the second luminescent material. The fact that the transmissive arrangement comprises the second luminescent material does not exclude that part of the (second) luminescent material may be arranged elsewhere in the illumination device; however, in a specific embodiment, substantially all second luminescent material is comprised by the transmissive arrangement. The phrase "the transmissive arrangement comprises the second luminescent material" may relate to a transmissive arrangement selected from the group consisting of a transmissive arrangement wherein the second luminescent material is embedded in the transmissive arrangement, a transmissive arrangement that is second luminescent material itself, a transmissive arrangement having a downstream coating comprising the second luminescent material (side facing to the exit window), a transmissive arrangement having an upstream coating comprising the second luminescent material (side facing the LED(s), a transmissive arrangement comprising both an upstream and downstream coating comprising the second luminescent material, and combinations of two or more of these options, such as a transmissive arrangement that is the second luminescent material itself and having a downstream coating with second luminescent material.

Since the second luminescent material may also be a combination of luminescent materials, these luminescent materials may be arranged as combination, but may also be arranged at different positions. For instance, also a transmissive arrangement comprising a second luminescent material embedded in the transmissive arrangement itself or that is the luminescent material itself, may be provided, in combination with a "third" luminescent material embedded in one or more upstream or downstream coatings on the transmissive arrangement.

In a preferred embodiment, the transmissive arrangement has an upstream face comprising the coating, wherein the coating comprises at least part of the second luminescent material. Such embodiment may both benefit from the remote position of the second luminescent material (i.e. remote from the LED) and from a relative remote position from the exit window (desaturation of the colour of the exit window when illuminated with white light).

In a specific embodiment, at least part of the second luminescent material comprises a transmissive ceramic luminescent material, and wherein the transmissive arrangement comprises the transmissive ceramic luminescent material. Hence, in this embodiment, the transmissive arrangement is a luminescent ceramic. Especially suitable luminescent ceramics are based on cerium containing garnets, or are based on (divalent) europium containing nitridosilicates, as described herein. Transmissive ceramic layers or luminescent ceramics, and their method of preparation, are known in the art. It is for instance referred to U.S. patent application Ser. No. 10/861, 172 (US2005/0269582), to U.S. patent application Ser. No. 11/080,801 (US2006/0202105), or to WO2006/097868, to WO2007/080555, to US2007/0126017 and to WO2006/114726. The documents, and especially the information about the preparation of the ceramic layers provided in these documents, are herein incorporated by reference.

The arrangement of a transmissive ceramic layer comprising the second luminescent material instead of arranging the luminescent material to the LED allows a non-zero distance between the second luminescent material and the light source. This distance is herein indicated as dLL (second luminescent material light source distance). Distance dLL is especially a shortest distance. This means that in an embodiment, any shortest distance between the light source and the second luminescent material is larger than 0 mm. In an embodiment the second luminescent material light source distance (dLL) is in the range of 0.1-50 mm, especially in the range of 0.1-30 mm, more especially 0.1-15 mm, such as at least 0.2 mm, like about 0.5-2 mm, or about 1-30 mm, like 1-15 mm The illumination device may comprise more than one transmissive arrangements, with one or more of such transmissive arrangements comprising luminescent material, possibly with different luminescent material LED distances (dLL). The more than one transmissive arrangements may for instance comprise different luminescent materials.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 1a-1c schematically depict a non-limiting number of possible configurations of the illumination device of the invention;

Figure 2A:
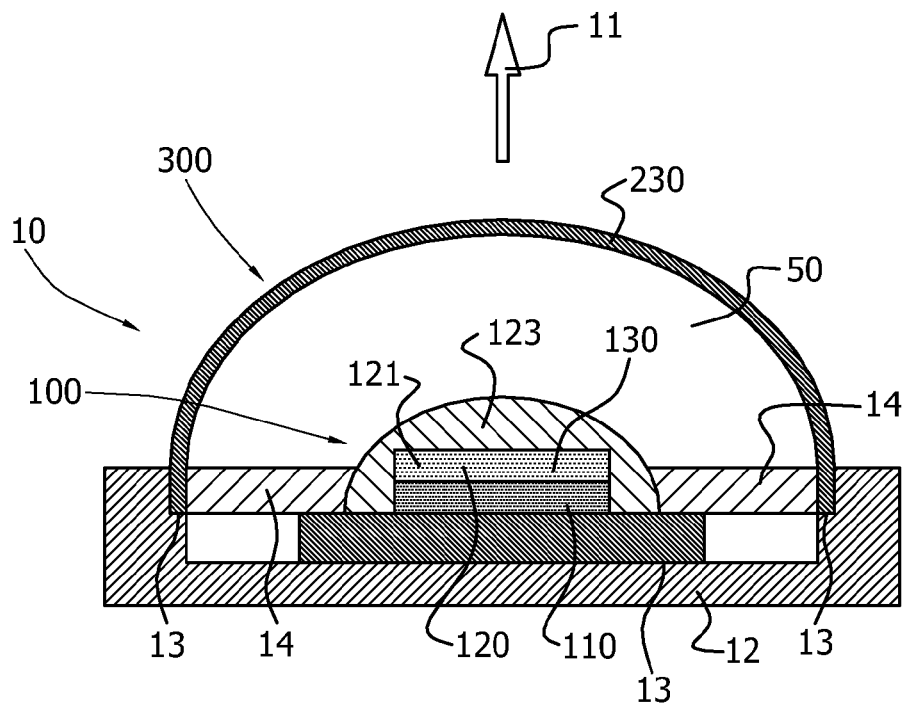
FIGS. 2a-2b schematically depict a non-limiting number of embodiments of the illumination device in cross-sectional view.

Only the essential elements are depicted. Other elements, like drivers, further optics, like optical filters, collimators (except for FIG. 4), fittings, etc., known to the person skilled in the art, are not depicted in the schematic drawings.

DESCRIPTION OF PREFERRED EMBODIMENTS

FIGS. 1a-1c schematically depict embodiments of an illumination device 10 according to the invention. The illumination device 10 comprises a light source 100 and a transmissive arrangement 200, remote from the light source 100. The light source 100 is arranged to generate light source light 101, and comprises a light emitting device (LED) 110, arranged to generate LED light 111 and a carrier 120 comprising a first luminescent material 130. The carrier 120 is in contact with the LED 110. The first luminescent material 130 is arranged to convert at least part of the LED light 111 into first luminescent material light 131.

The transmissive arrangement 200 of a second luminescent material 230 is arranged remote from the light source 100 and is arranged to convert at least part of the LED light 111 or at least part of the first luminescent material light 131, or at least part of the LED light 111 and at least part of the first luminescent material light 131 into second luminescent material light 231. Thereby, illumination device light 11 is generated.

FIG. 1a schematically depicts the carrier 120 as luminescent material layer or luminescent ceramic. FIG. 1b schematically depicts the carrier 120 as encapsulant 123, such as a resin, comprising first luminescent material 130.

FIG. 1c further schematically depicts propagation of light rays. First, it is noted that the carrier 120 is directly downstream of the LED 110. Further, the transmissive arrangement 200 is downstream and remote from the carrier 120 (and thus also from the LED 110). The LED 110 generates LED light 111. Further, the carrier 120, or more precisely the first luminescent material 130 comprised by the carrier 120, generates first luminescent material light 131 due to absorption of the LED light 111. In this way, light source light 101 is generated, which comprises luminescent material light 131 and optionally LED light 111.

This light source light 101 may at least partially be transmitted and partially be absorbed by the transmissive arrangement 200. The transmissive arrangement 200 comprises second luminescent material 230, which upon absorption of the LED light 111 and/or absorption of the first luminescent material light 131 emit second luminescent material light 231. In this way, downstream of the transmissive arrangement 200, illumination device light 11 is found. This illumination device light 11 comprises second luminescent material light 231, first luminescent material light 131 and optionally LED light 111.

Figure 2B:
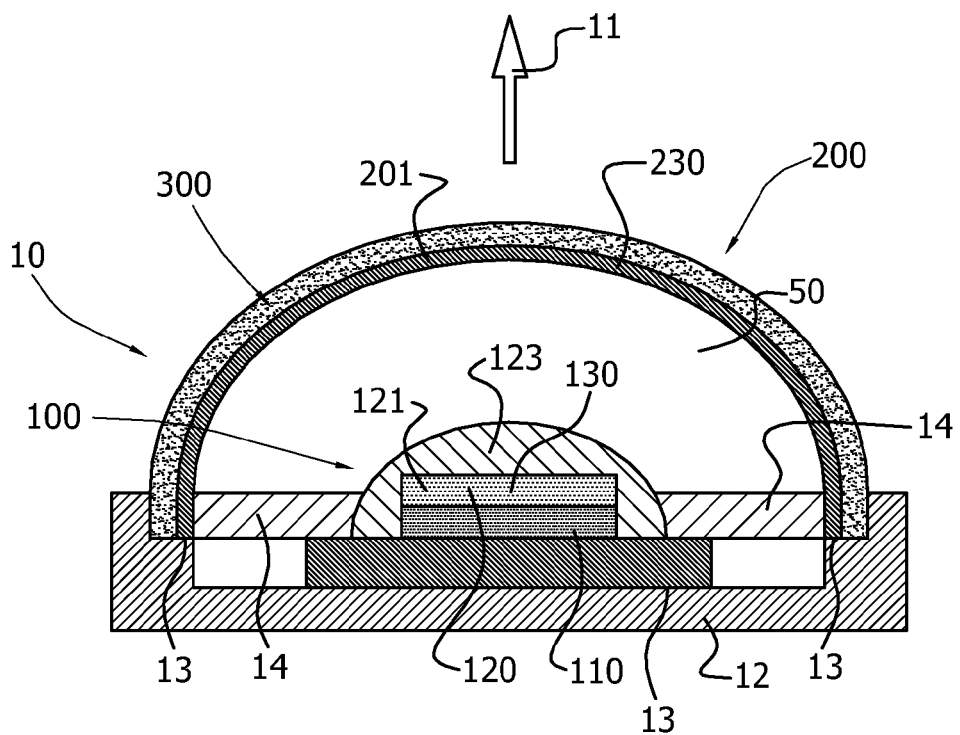

FIGS. 2a-2b schematically depict embodiments wherein the arrangement 200 is a dome, especially a half dome, at least partially enclosing the light source 100. In this way, cavity or chamber 50 is created. In both examples, the first luminescent material 130 is comprised by carrier 120, which is a by way of example a luminescent ceramic 121 or a luminescent layer. In both examples, the first carrier 120 is enclosed by a encapsulant 123 (which in these embodiment may not comprise first luminescent material 130). The light source 100 is arranged on a support, such as a PCB. The support is also indicated as heat sink 12. Thermal connects are indicated with reference 13. The cavity 50 may further be formed by parts of this support, but may optionally also be formed by reflectors. In both embodiments, reflectors 14 are integrated in the cavity. In this way, the outcoupling from the cavity 50 may be optimized.

Preferably the first luminescent material is applied in the form of a monolithic ceramic luminescent element with relative high translucency (substantially higher than for a powder luminescent material suspension to achieve the same colour point) and relative high heat conduction to the LED die (again substantially higher than for a powder luminescent material suspension in a silicon rubber matrix material).

The remote luminescent element, indicated as second luminescent material 230, is either a self-supporting luminescent body, e.g. a monolithic luminescent ceramic or a powder luminescent material dispersed in a matrix material such as polycarbonate, or a supporting structure with a luminescent material coating, e.g. a glass or ceramic (e.g. YAG) spherical shell with a luminescent material coating on the inside. When applying the second luminescent material 230 coating on the outside, preferably the luminescent material particles are embedded in a matrix material, e.g. a sol gel material. Preferably only inorganic materials are used in the remote second luminescent material 230 to enable relative high temperatures. Preferably the arrangement is a relative good heat conductor such as alumina ceramic, with a good thermal contact to a heat sink.

The surface area of the arrangement 200 is preferably at least 10 times larger than the surface area of the die. Furthermore, the arrangement 200 is preferably mounted such that an air gap remains between the LED die or the encapsulant of the LED die (i.e., the primary optic or lens of the LED) and the arrangement 200.

FIG. 2a schematically depicts an element wherein first luminescent material 130 is comprised in a luminescent ceramic 121 and the second luminescent material 230 is embedded in the arrangement 200. This arrangement 200 is here depicted as exit window 300 (for instance polycarbonate (PC) or a (monolithic) luminescent ceramic). FIG. 2b schematically depicts an embodiment wherein the first luminescent material 130 is also comprised by a luminescent ceramic 121, and the second luminescent material 230 is comprised by a coating 201, coated to the exit window 300, here to the upstream face of the exit window 300. The exit window 300 comprising the second luminescent material 230 is (also) indicated as arrangement 200.

FIGS. 3a-3d schematically depict embodiments with a plurality of LEDs 110 and/or a plurality of carriers 120. By way of example, the exit window 300 is depicted as transmissive carrier comprising second luminescent material 230, such as a polymer matrix comprising the second luminescent material 230 or a (monolithic) luminescent ceramic. The walls and part of the bottom of the cavity 50 are provided with reflector 14.

FIGS. 3a-3d schematically depict several embodiments of light sources 100 with partial remote luminescent material 230 enabling relative high source brightness by reduced heat dissipation in the remote luminescent material 230.

Figure 3A:
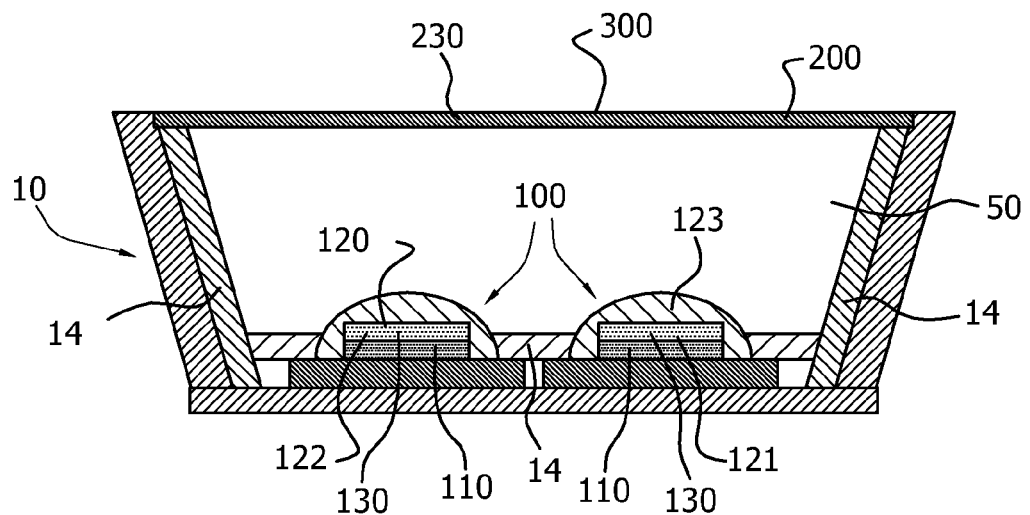
FIGS. 3a-3d schematically depict a non-limiting number of embodiments of the illumination device in cross-sectional view.

By way of example, in FIG. 3a, one light source 100 comprises the first luminescent material 130 as luminescent material layer 122 (left light source 100), and another light source 100 comprises the first luminescent material 130 as luminescent ceramic 121 (right light source 100). In both light sources 100, the luminescent material 130 is encapsulated by an encapsulant 123. The (red or red-orange) (ceramic luminescent) arrangement 200 is mounted in thermal contact with a heat sink 12.

Figure 3B:
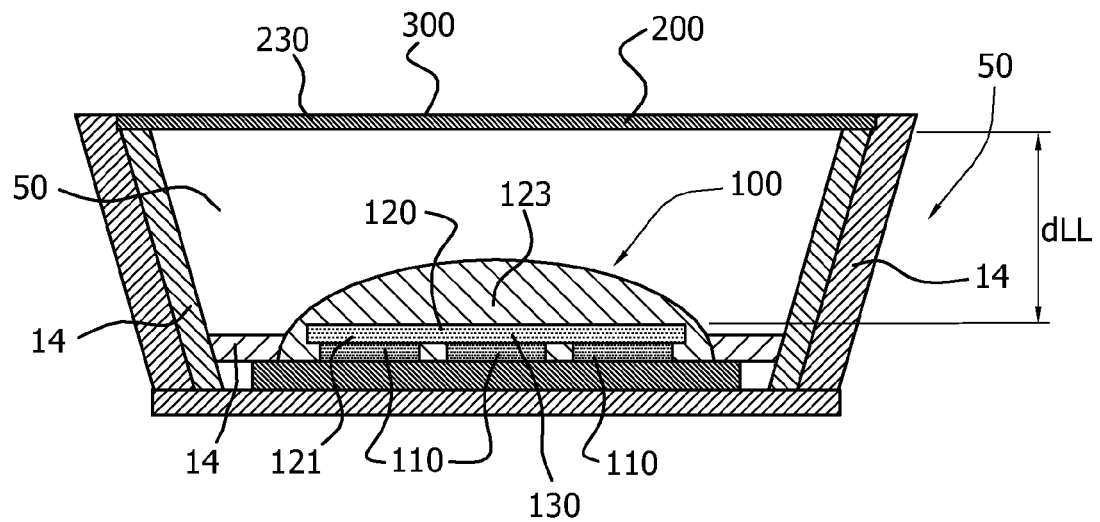

FIG. 3b schematically depicts multiple blue LEDs 110 combined with single carrier 120, such as a yellow emitting ceramic colour converter in the LED package.

Figure 3C:
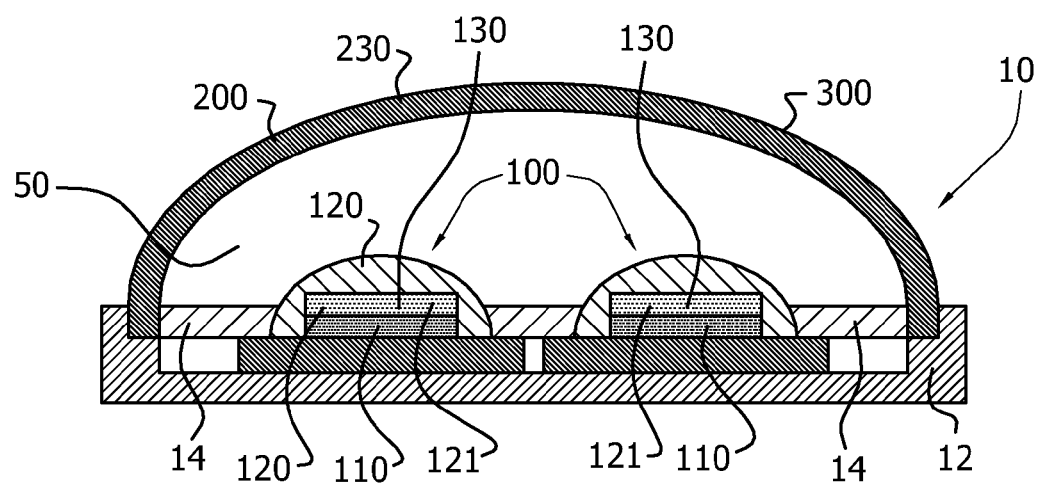

FIG. 3c schematically depicts an arrangement 200, such as a monolithic ceramic luminescent material 230, as dome-shaped shell mounted over the light sources 100.

Figure 3D:
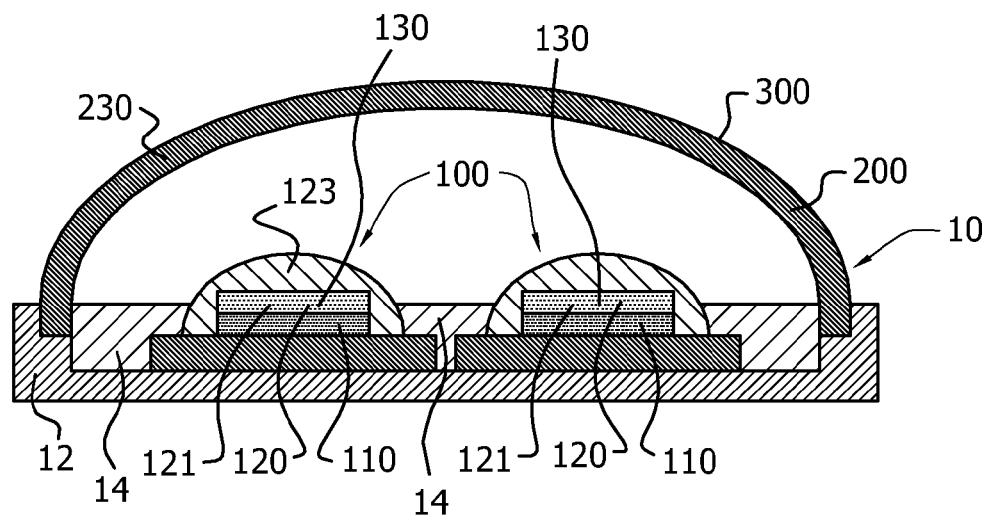

FIG. 3d schematically depicts an embodiment with a combination of light sources 100 comprising LEDs 110 and yellow and green luminescent ceramic carriers 120 with a common arrangement 200, which may especially comprise a ceramic (red or red-orange) remote luminescent material 230. The term "red or red-orange luminescent material" and similar terms indicate luminescent materials that emit emission in the red or orange part of the visible spectrum, respectively.

Figure 4:
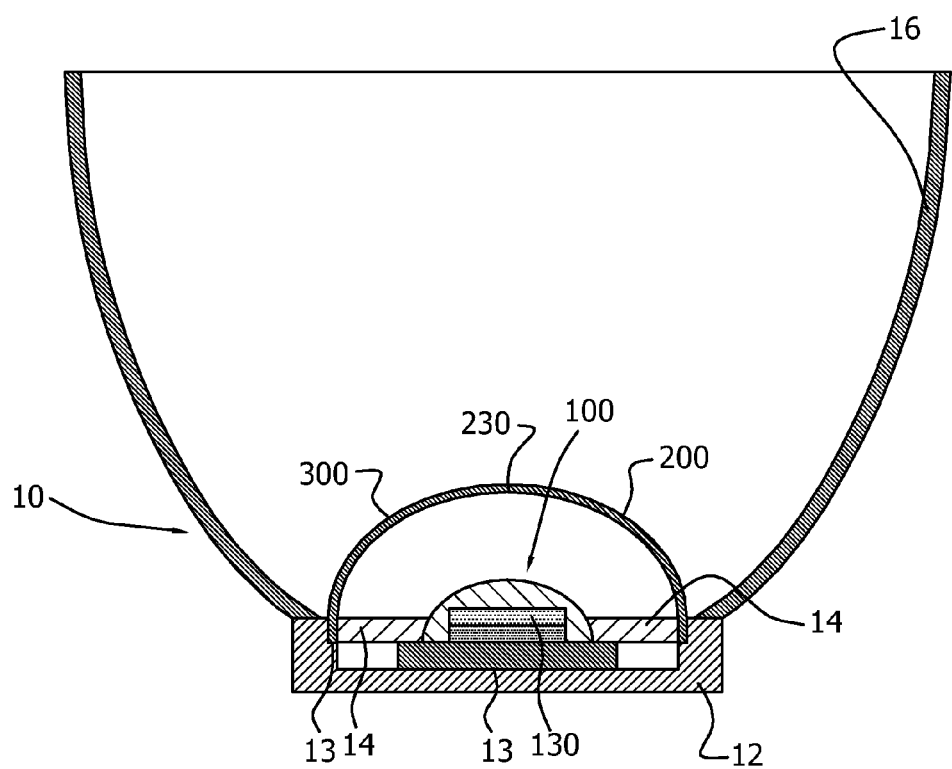
FIG. 4 schematically depicts an embodiment of the illumination device in cross-sectional view.

FIG. 4 schematically depicts an embodiment of the illumination device 10 of the invention, further comprising a collimator 16. As will be clear to the person skilled in the art, the use of the collimator 16 is not confined to the specific configuration of light source 100 and arrangement 200 displayed here, but the collimator 16 may also be used for other configurations, such as displayed in FIGS. 3a-3d. The collimator 16 may be in thermal contact with the support 13 and thus become part of the heat sink 12.

Figure 5A:
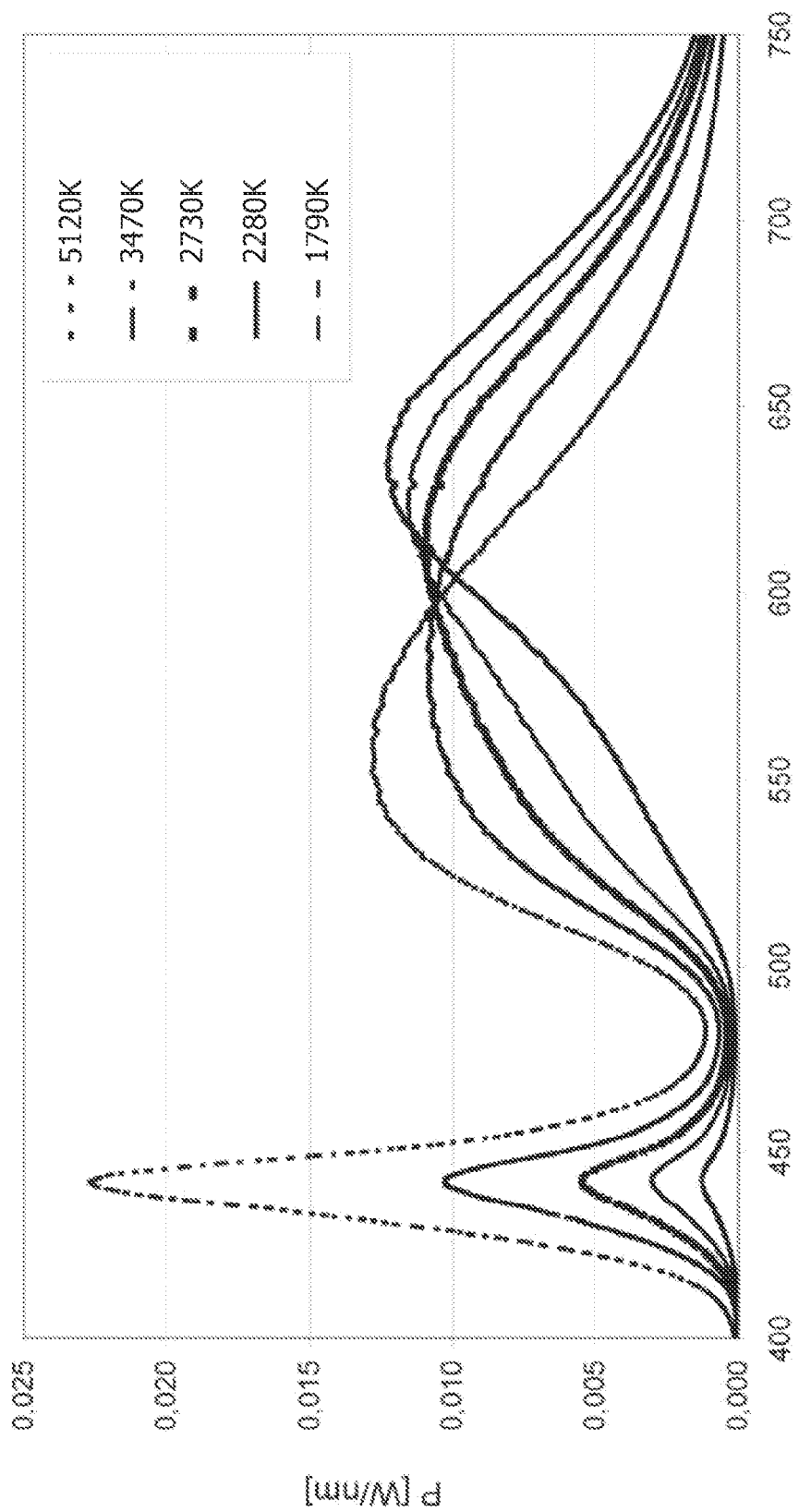
FIGS. 5a-5b depict optical results of illumination devices.

In FIG. 5a some spectra (power density in W/nm vs. wavelength in nm) are shown that were measured with a light source comprising cool white LEDs with a correlated colour temperature just over 5000 K and a remote luminescent material element comprising a red nitride luminescent material. In this figure, experimental spectra obtained with cool white LEDs and a red emitting remote luminescent material element are shown, where only the layer thickness of the remote luminescent material is varied. The correlated colour temperatures that were obtained with various remote luminescent material loads are indicated in the figure, and range from ca. 1800 K and up, but could increase up to the colour temperature of the white LEDs (ca. 5100 K in this case). At about 440 nm, from high to low intensity, the curves of 5120 K, 3470 K, 2730 K, 2280 K and 1790 K, respectively, are displayed. At about 550 nm, the order is the same; at 650 nm, the order is reversed, with the curve of 1790 K providing the highest intensity at this wavelength, and the curve of 5120 K providing the lowest intensity.

Figure 5B:
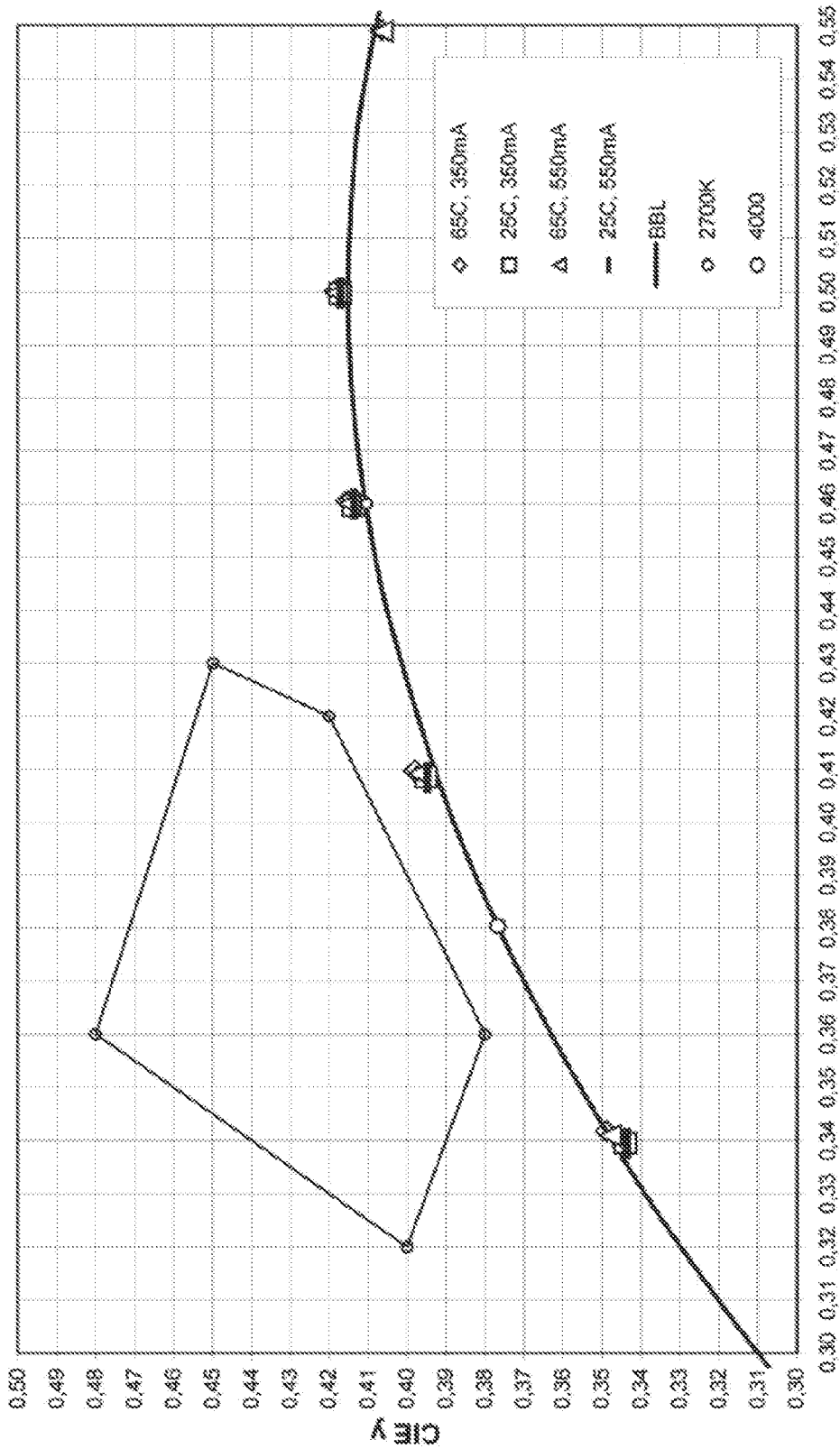

In FIG. 5b, the chromaticity area is indicated that has been claimed in U.S. Pat. No. 7,213,940B1 for the light emission from blue LEDs and a yellow luminescent material that, in combination with light from red LEDs with a dominant wavelength between 600 and 630 nm results in white light. Also indicated are the chromaticity coordinates of the cool-white LEDs used in the LED module that was realized in accordance with the design rules as described in this invention disclosure, and the coordinates of the module with several remote luminescent material components (where only the luminescent material load was varied). It is clear from the graph that the white emitters are outside the range as claimed in the prior art patent mentioned above. Furthermore, with the systems as defined by this invention disclosure, a much wider range of colour temperatures can be realized than with systems built according to U.S. Pat. No. 7,213,940B1, because the remote luminescent material component converts not only blue, but also yellow-green light, and as a result the white LEDs only define the upper colour temperature of the light emitted by the module, while the actual colour temperature is determined by the red luminescent material layer thickness.

It is also observed in this figure that the resulting colour points do hardly vary with varying driving or ambient conditions, and furthermore that the colour points are very close to the black body locus while only the layer thickness of the red remote luminescent material is varied. This enables extremely simple realization of products with different colour temperatures, because the same LEDs and the same luminescent material can be used for all these products. The illumination device according to the invention may (thus) also provide light which has a colour point much closer to the BBL, such as within about 15 SDCM, especially within about 10 SDCM, even more especially within about 5 SDCM.

With today's achievable values for the LED wall plug efficiency and the quantum efficiency of yellow-green and red-orange luminescent materials, the relative heat generation in the LED and the two luminescent materials can be determined; the results for a colour temperature of 3000K are presented in Table 1.

TABLE 1

Relative power dissipation in blue LED, "red luminescent material" ((Sr,Ca)AlSiN$_3$:Eu) and "green luminescent material" (YAG:Ce) to obtain 3000K colour point for two different pump conditions of the red luminescent material.

| Tc = 3000K | WPE | QE | Relative luminous flux | Relative optical power | Relative heat dissipation when red fully pumped by blue | Relative heat dissipation when red fully pumped by green |
|---|---|---|---|---|---|---|
| Red | | 90% | 19% | 31% | 4.3% | 2.1% |
| Green | | 90% | 79% | 58% | 6.1% | 9.6% |
| Blue | 40% | | 2% | 11% | 89.6% | 88.3% |

In the following table (Table 2), the relative heat dissipation in the remote luminescent material element is calculated with the configuration as a parameter (as can be distilled from the data in Table 1).

TABLE 2

Heat dissipation in the second (remote) luminescent element for two different configurations (both green and red luminescent materials in the remote element vs. only red in the remote element) and two different pump conditions for the red luminescent material (pumped exclusively by blue vs. pumped exclusively by green).

| 3000K | Red fully pumped by blue | Red fully pumped by green |
|---|---|---|
| Green + Red remote | 10.4% | 11.7% |
| Green local (on LED), Red remote | 4.3% | 2.1% |

From these results it can be concluded that the heat dissipation in the remote luminescent material element can be reduced by a factor 5 when applying only the red luminescent material in the second (remote) luminescent element and pumping this luminescent material primarily by the light from the green luminescent material. Although the latter is a little less efficient due to the double QE losses when generating red light, it results in a significantly lower thermal load of the remote luminescent material. Therefore, with this approach the brightness of the light source can be increased by a factor 5 as compared to a light source with full remote luminescent material application, assuming identical thermal restrictions to the remote luminescent material component. Significant further brightness increase is enabled by the application of only inorganic materials for the remote luminescent material component. Although for some red luminescent materials this is limited by their thermal quenching, for at least the class of (Ca,Ba,Sr)AlSiN$_3$:Eu red to red-orange emitting nitride luminescent materials this should enable a further doubling of the source brightness. Overall a brightness increase relative to fully remote luminescent material light sources by a factor of 10 can be expected for light source configurations according to the invention.

Therefore, in agreement with the above mentioned measures an LED spot lamp configuration is proposed in which a first luminescent element (indicated as carrier) with low light scattering properties is applied in the LED package (on the LED die) that accounts for a substantial part, preferably most, of the required wavelength conversion and that results in an efficient heat transfer from the luminescent material element to the substrate of the LED package, and a second luminescent element that may have relative high light scattering properties that is located at a distance from the LED to convert a substantial part, preferably a relative small part, of the light with relative low heat dissipation and therefore stays relative cool, even at relative high brightness. To improve this effect, the second (remote) luminescent element is chosen such that it converts primarily, or at least part of, the light emitted from the luminescent element (indicated as carrier) on the LED, thus reducing the Stokes shift losses in the second luminescent element. Preferably, both the first and the second luminescent element are monolithic ceramic luminescent elements. Preferably, the first luminescent element comprises a garnet luminescent material $(Y_xLu_{1-x})_3Al_5O_{12}$:Ce ($0 \leq x \leq 1$), and the second luminescent element comprises a nitride luminescent material such as $(Ca_xSr_yBa_{1-x-y})AlSiN_3$:Eu ($0 \leq x \leq 1$, $0 \leq y \leq 1-x$) or $(Ca_xSr_yBa_{1-x-y})_2Si_5N_8$:Eu ($0 \leq x \leq 1$, $0 \leq y \leq 1-x$). Preferably, the first luminescent element is a flat plate and the second luminescent element is a dome-like shell. Preferably the correlated colour temperature of the light emitted by the LED package comprising the first luminescent element is higher than 4100K. Preferably the correlated colour temperature of the light emitted by the system comprising the LED with the first luminescent element and the second luminescent element is lower than 4100K.

In a further aspect, the invention provides an illumination device comprising (a) a light source, arranged to generate light source light, comprising (a1) a light emitting device (LED), arranged to generate LED light, and (a2) a carrier comprising a first luminescent material, wherein the carrier is in contact with or over the LED, such as at a shortest distance in the range of 0.1-5 mm, such as 0.1-2, especially 0.1-1, like 0.2-2 mm, and wherein the first luminescent material is arranged to convert at least part of the LED light into first luminescent material light; and (b) a transmissive arrangement of a second luminescent material, arranged remote from the light source, and arranged to convert at least part of the LED light or at least part of the first luminescent material light, or at least part of the LED light and at least part of the first luminescent material light into second luminescent material light For instance, referring to FIGS. 1a, 1c, 2-4, there might also be a shortest non-zero distance between the LED and the carrier.

The term "substantially" herein, such as in "substantially all emission" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The devices herein are amongst others described during operation. For instance, the term "blue LED" refers to an LED which during operation thereof generates blue light; in other words: the LED is arranged to emit blue light. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The term "and/or" may include any and all combinations of one or more of the associated listed items. The article "a" or "an" preceding an element does not exclude the presence of a plurality of such elements. The article "the" preceding an element does not exclude the presence of a plurality of such elements. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. An illumination device comprising:
   a light source, arranged to generate light source light, comprising:
   a light emitting device (LED), arranged to generate LED light;
   a carrier comprising a first luminescent material, wherein the carrier is in contact with the LED, and wherein the first luminescent material is arranged to convert at least part of the LED light into first luminescent material light;
   wherein the first luminescent material is a low light scattering material and wherein the first luminescent material provides a relative high heat conduction to the LED;
   a transmissive arrangement of a second luminescent material, arranged remote from the light source and the carrier such that an air gap is formed between the carrier and the transmissive arrangement, the transmissive arrangement arranged to convert at least part of the LED light or at least part of the first luminescent material light, or at least part of the LED light and at least part of the first luminescent material light into second luminescent material light;
   wherein the second luminescent material is a high light scattering material.

2. The illumination device according to claim 1, wherein the LED comprises a blue emitting LED, wherein the first luminescent material is arranged to emit light with a dominant wavelength in the yellow-green spectral range, and wherein the second luminescent material is arranged to emit light with a dominant wavelength in the red-orange range.

3. The illumination device according to claim 1, wherein the LED comprises a blue emitting LED, wherein the first luminescent material comprises one or more luminescent materials selected from the group consisting of a trivalent cerium containing garnet, a divalent europium containing oxynitride, a divalent europium containing silicate, a divalent europium containing thiogallate, and wherein the second luminescent material comprises one or more luminescent materials selected from the group consisting of a trivalent cerium containing earth alkali sulphide and a divalent europium containing nitride.

4. The illumination device according to claim 1, wherein the second luminescent material comprises (Ca,Sr,Ba)AlSiN3:Eu.

5. The illumination device according to claim 1, wherein the second luminescent material comprises (Ca,Sr,Ba)2Si5N8:Eu.

6. The illumination device according to claim 1, wherein the carrier comprises a luminescent ceramic.

7. The illumination device according to claim 1, wherein the carrier comprises a luminescent material layer.

8. The illumination device according to claim 1, wherein the carrier comprises an encapsulant comprising the first luminescent material.

9. The illumination device according to claim 1, wherein the carrier and the transmissive arrangement are in contact with a heat sink.

10. The illumination device according to claim 1, wherein the transmissive arrangement comprises a coating coated to an exit window, wherein the coating comprises the second luminescent material.

11. The illumination device according to claim 1, wherein the transmissive arrangement comprises an exit window comprising the second luminescent material.

12. The illumination device according to claim 1, wherein the transmissive arrangement includes an exit window which has a hollow shape and encloses at least partially the light source.

13. The illumination device according to claim 1, wherein the light source light is white light, having a colour point within 15 SDCM, standard deviation of colour matching, of the black body locus.

14. The illumination device according to claim 1, wherein the second luminescent material is arranged to convert at least part of the first luminescent material light.

15. The illumination device according to claim 1, wherein the illumination device is arranged to generate illumination device light comprising first luminescent material light and second luminescent material light and optionally LED light, wherein the illumination device further comprises a collimator which at least partially encloses the light source and the transmissive arrangement and which is arranged to collimate the illumination device light.

16. An illumination device comprising:
   a light source arranged to generate light source light, comprising:
   a light emitting device (LED) arranged to generate LED light;
   a carrier positioned over the LED and including a first luminescent material, wherein the carrier is in contact with the LED and wherein the first luminescent material is arranged to convert a substantial portion of the LED light into first luminescent material light;
   wherein the first luminescent material is a low light scattering material, the LED emits a substantially blue LED light and the first luminescent material light is a short wavelength light;
   a transmissive arrangement of a second luminescent material, arranged remote from the carrier such that an air gap is formed between the carrier and the transmissive arrangement, the transmissive arrangement arranged to convert at least part of the LED light or at least part of the first luminescent material light, or at least part of the LED light and at least part of the first luminescent material light into second luminescent material light;

wherein the second luminescent material light has a longer wavelength than the first luminescent material light.

17. An illumination device comprising:

a light source arranged to generate light source light, comprising:

a light emitting device (LED) arranged to generate LED light;

a carrier positioned over the LED and including a first luminescent material, wherein the carrier is in contact with the LED and wherein the first luminescent material is arranged to convert a substantial portion of the LED light into first luminescent material light;

wherein the first luminescent material is a low light scattering material, having a yellow-green phosphor a transmissive arrangement of a second luminescent material, arranged at a non-zero distance from the light source and the carrier such that an air gap is formed between the carrier and the transmissive arrangement, the transmissive arrangement arranged to convert at least part of the LED light or at least part of the first luminescent material light, or at least part of the LED light and at least part of the first luminescent material light into second luminescent material light;

wherein the second luminescent material light has one of a red or red-orange phosphor.

* * * * *